United States Patent [19]
Norton

[11] Patent Number: 5,115,188
[45] Date of Patent: May 19, 1992

[54] RESISTANCE SENSOR AND SWITCH

[76] Inventor: Peter Norton, P.O. Box 336, Denville, N.J. 07834

[21] Appl. No.: 405,399

[22] Filed: Sep. 11, 1989

Related U.S. Application Data

[63] Continuation of Ser. No. 262,135, Oct. 19, 1988, abandoned, which is a continuation of Ser. No. 74,076, Jul. 16, 1987, abandoned.

[51] Int. Cl.$^5$ .......................................... G01R 27/02
[52] U.S. Cl. ................................... 323/365; 324/706
[58] Field of Search ............... 323/364, 365; 324/705, 324/706, 713, 725, 691; 340/660, 661

[56] References Cited

U.S. PATENT DOCUMENTS 4,229,692 10/1980 Graeme .......................... 324/725 X

FOREIGN PATENT DOCUMENTS 2163828 6/1973 Fed. Rep. of Germany ........ 324/62
2915016 9/1980 Fed. Rep. of Germany ........ 324/62

*Primary Examiner*—Steven L. Stephan
*Assistant Examiner*—Kristine Peckman
*Attorney, Agent, or Firm*—Reising, Ethington, Barnard, Perry & Milton

[57] ABSTRACT

A circuit for detecting resistance changes in an electrically resistive device is disclosed. The circuit comprises a bridge circuit with first and second MOSFET transistors in adjacent arms of the bridge and the resistive device and a comparison resistor in the other adjacent arms of the bridge. The first MOSFET transistor is connected in series with the resistive device across input terminals of the bridge and the second MOSFET transistor is connected in series with the comparison resistor across the input terminals of the bridge. The drains of the transistors are connected together and the gates of the transistors are connected together. The resistance of the second transistor is higher than the resistance of the first transistor by a predetermined multiple and the resistance or the comparison resistor is greater than the nominal resistance of the resistive device by the same multiple. Accordingly, when the resistive device has resistance equal to its nominal value the voltage between the output terminals of the bridge is zero. If the resistance of the resistive device deviates from its nominal value the voltage at the output terminals of the bridge will vary correspondingly.

10 Claims, 1 Drawing Sheet

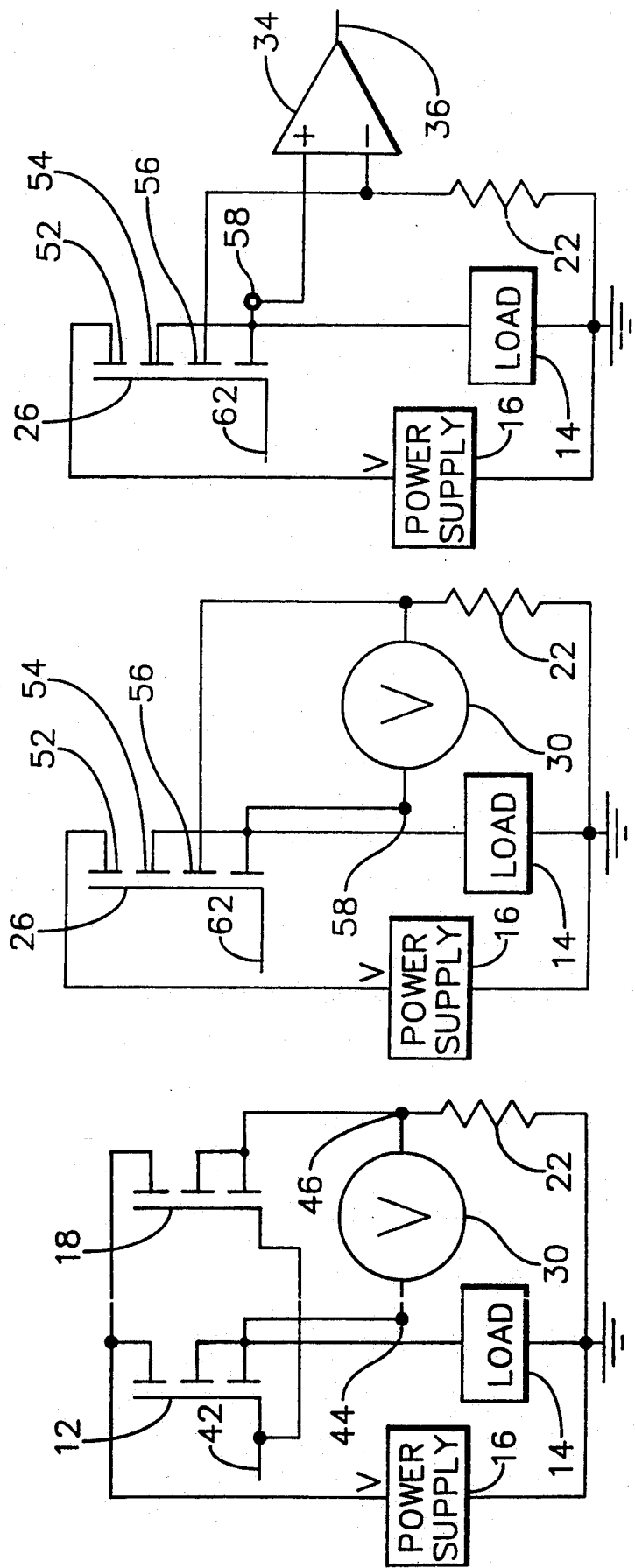

RESISTANCE SENSOR AND SWITCH

This application is a continuation of application Ser. No. 262,135, filed Oct. 10, 1988, now abandoned which is a continuation of application Ser. No. 074,076, filed Jul. 16, 1987, now abandoned.

FIELD OF THE INVENTION

This invention relates to means for monitoring the resistance of a load device; more particularly it relates to monitoring the resistance of a resistive load turned on and off by a transistor of the MOSFET type.

BACKGROUND OF THE INVENTION

There are many situations where it is desirable to monitor the resistance of a power consumer. One example is a heating element in which the resistance of the heating element is an indication of its temperature. It is well known in the art to use a resistance bridge to compare an unknown resistance with a reference resistance. Resistance bridges require three resistances in addition to the one being measured and one of the resistances must carry the full current of the load. This results in a requirement for a resistor capable of conducting the full load current on the side of the bridge containing the load. Also the voltage drop across this resistor represents power used only for the purpose of resistance measurement. Mosfet power transistors are commonly used to control the power to a load circuit. In the prior art both the power transistor and the resistance bridge are required; the power transistor to control the power to the load and the bridge to measure the resistance of the load. Recently, a modified form of the MOSFET power transistor called a SENSEFET has become available in which a very few cells have their sources separated from the remaining sources and brought to a separate connection point outside the transistor. It is well known to use SENSEFET transistors in systems to measure the current being conducted by the transistor.

A general object of this invention is to provide an improved power switch and resistance sensor which overcomes certain disadvantages of the prior art.

SUMMARY OF THE INVENTION

In accordance with this invention, a circuit is provided for detecting resistance changes in a resistive device such as a load circuit. This is accomplished by a bridge circuit including a pair of MOSFET transistors, one for supplying current to the resistive device and the other for supplying current to the comparison resistor. The transistors are turned on simultaneously and an unbalanced condition indicated by a voltage at the output of the bridge is indicative of a change of resistance in the resistive device.

Further, in accordance with this invention, a circuit for detecting resistance changes in a resistive device comprises a bridge circuit having a pair of input terminals and a pair of output terminals with first and second MOSFET transistors, a comparison resistor and the resistive device connected in the bridge circuit. The first MOSFET transistor is coupled between one input terminal and one output terminal of the bridge and the resistive device is coupled between the one output terminal and the other input terminal. The second MOSFET transistor is coupled between the one input terminal and the other output terminal and the comparison resistor is coupled between the other output terminal and the other input terminal. The drains of the MOSFET transistors are connected together and the gates of the MOSFET transistors are connected together. A voltage sensor may be connected between the output terminals for indicating the change of resistance. Preferably, the first and second MOSFET transistors are comprised of a singe SENSEFET transistor.

A complete understanding of this invention may be obtained from the detailed description that follows taken with the accompanying drawings.

DESCRIPTION OF THE DRAWINGS

FIG. 1 is a schematic diagram of the switch and resistance sensor of the invention in which the voltage between the two sides of the bridge is sensed with a voltage sensor.

FIG. 2 is a schematic diagram of a circuit that is the same as the circuit as FIG. 1 except that the two transistors of FIG. 1 are replaced with a single SENSEFET transistor.

FIG. 3 is a schematic diagram of an application of the switch and resistance sensor of the invention in which a comparator is used to generate a logic signal that is high or low depending respectively on whether or not the resistance of the load is greater than or less than a predetermined value.

BEST MODE FOR CARRYING OUT THE INVENTION

Referring now to the drawings, there are shown three illustrative embodiments of the invention as previously described. It will be appreciated as the description proceeds that the invention is useful in other applications and in different embodiments.

The resistance sensor and switch of this invention is represented by a schematic diagram in FIG. 1. The system comprises, in general, a first mosfet transistor 12 series connected with load circuit 14 the series combination being connected between the V and ground terminals of a source 16 of electric power. It also comprises a second mosfet transistor 18 of much higher internal resistance series connected with a comparison resistor 22, the series combination being also connected between the V and ground terminals of the source 16 of electric power. The resistance of the second mosfet transistor 18 when it is conducting is a predetermined multiple of the resistance during conduction of the first mosfet transistor 12. The resistance of the comparison resistor 22 is greater than the nominal resistance of the load by the same predetermined multiple. The term "nominal resistance" as used herein means the actual resistance value of the load when measured under certain specified conditions. One terminal of a voltage sensor 30 is connected to the junction between the first mosfet transistor 12 and the load circuit 14. The other terminal is connected to the junction between the second mosfet transistor 18 and comparison resistor 22.

The operation of the resistance sensor and switch will now be summarized with reference to FIG. 1. When the first mosfet transistor 12 is not conducting the system is not operational. The conditions under which the transistor does or does not conduct depend on the design of the particular transistor being used and can be determined from literature supplied by the transistor manufacturer. When a control signal is applied to conductor 42 to cause first mosfet transistor 12 to conduct and supply power to load circuit 14 from source 16 it also causes second mosfet transistor 18 to conduct and supply power to comparison resistor 22. As mentioned previously, the resistance of the second mosfet transistor 18 is higher than the resistance of transistor 12 by a predetermined multiple. The resistance of comparison resistor 22 is greater than the nominal resistance of the load by the same multiple. Therefore when the load resistance is equal to its nominal value the voltage at junction 44 of voltage sensor 30 is equal to the voltage at junction 46. However, if the resistance of the load varies from its nominal value the voltage at junction 44 will vary correspondingly and this variation will be detected by voltage sensor 30.

A second embodiment of the resistance sensor and switch of this invention, as shown in schematic diagram in FIG. 2, will now be described. The system differs from that shown in FIG. 1 in that mosfet transistors 12 and 18 of FIG. 1 have been replaced by a SENSEFET transistor 26. A SENSEFET is a mosfet transistor in which the source elements of certain transistor cells, known as sense cells, are disconnected from the source elements of the remaining cells, known as power cells, and, instead, lead to a separate bonding pad that is connected to a separate connector on the outside of the transistor. The gate and drain elements of the sense cells remain tied to those of the remaining cells of the mosfet transistor. The collective resistance of the sense cells is greater than the collective resistance of the power cells by the ratio of the number of power cells to the number of sense cells. That ratio equals the ratio of the comparison resistance to the nominal load resistance. The drain elements 52 of all the cells of the SENSEFET are connected to the V terminal of the source 16 of electric power. The source elements 54 of the power cells are connected to the upper terminal of load circuit 14. The source elements 56 of the sense cells are connected to the upper terminal of comparison resistor 22. The series combination of the power cells of the SENSEFET 26 and the load circuit 14 is thereby connected between the V and ground terminals of the source 16 of electric power. The series combination of the sense cells of the SENSEFET 26 and comparison resistor 22 is thereby also connected between the V and ground terminals of the source 16 of electric power. One terminal of a voltage sensor 30 is connected to terminal 58 of SENSEFET 26. SENSEFET power cell source voltage sensing terminal 58 is connected directly to the source elements of the power cells to provide the power cell source voltage with maximum accuracy. The other terminal of voltage sensor 30 is connected to the junction between the SENSEFET transistor sense terminal 56 and comparison resistor 22.

The operation of the second embodiment of the resistance sensor and switch of this invention, as shown in schematic diagram in FIG. 2, will now be described. When an appropriate signal is applied to the gate terminal 62 of SENSEFET 26 to cause it to conduct, all cells will conduct thereby supplying power from the source of electric power 16 to the load 14 and to the comparison resistor 22. The voltage at SENSEFET power cell source voltage sensing terminal 58 is applied to one terminal of voltage sensor 30. As mentioned previously, the resistance of the sense cells of the SENSEFET 26 taken collectively is higher than the resistance of the power cells taken collectively by a predetermined multiple. The multiple is the ratio of the number of power cells to the number of sense cells. The resistance of comparison resistor 22 is greater than the nominal resistance of the load by the same multiple. Therefore, when the load resistance is equal to its nominal value the voltage at sensing terminal 58 is equal to the voltage at junction 46. However, if the resistance of the load varies from its nominal value the voltage at junction 58 will vary correspondingly and this variation will be detected by voltage sensor 30.

A third embodiment of the resistance sensor and switch of this invention, as shown in schematic diagram in FIG. 3, will now be described. The noninverting terminal of a comparator 34 is connected to power cell source voltage sensing terminal 58 of SENSEFET 26. The inverting input of comparator 34 is connected to the junction between the sense cell source elements 56 of SENSEFET transistor 26 and comparison resistor 22. The output lead 36 of comparator 34 may be connected to any circuit (not shown) that one desires to control by a logic signal indicating that the resistance of load circuit 14 is or is not less than a predetermined value.

The operation of the third embodiment of the resistance sensor and switch of this invention, as shown in schematic diagram in FIG. 3, will now be described. The system differs from that shown in FIG. 2 in that voltage sensor 30 of FIG. 2 has been replaced by the comparator 34. The voltage at SENSEFET power cell source voltage sensing terminal 58 is applied to one terminal of comparator 34. The other terminal of comparator 34 receives the voltage at the junction between the source elements 56 and comparison resistor 22. The resistance of comparison resistor 22 is greater than the nominal resistance of the load by the ratio of the number of power cells to the number of sense cells. Therefore when the load resistance is equal to its nominal value the voltage at the noninverting terminal of comparator 34 is equal to the voltage at the inverting terminal. However, if the resistance of the load varies from its nominal value the voltage seen by the comparator will vary correspondingly and the logic signal on the output connection 36 of comparator 34 will be at a logic high when the resistance of load circuit 14 is greater than its nominal value and will be at a logic low when the resistance of load circuit 14 is less than its nominal value. This signal may be used for any useful purpose. One use of the signal would be to indicate that the load is overheated. In this case the logic high signal on connection 36 might be used in conjunction with other logic circuitry, not shown, to control the gate of SENSEFET transistor 26 to turn off load 14 for a predetermined time interval to allow it to cool.

Although the description of this invention has been given with reference to a particular embodiment, it is not to be construed in a limiting sense. Many variations and modifications will now occur to those skilled in the art. For a definition of the invention reference is made to the appended claims.

What is claimed is:

1. A circuit for detecting resistance changes in a resistive device, said circuit comprising:
 a bridge circuit having a pair of input terminals and a pair of output terminals,
 first and second MOSFET transistors,
 a resistive device,
 a comparison resistor,
 said first MOSFET transistor and said resistive device being coupled in series between said input terminals, said second MOSFET transistor and said comparison resistor being coupled in series between said input terminals, one of said output terminals being connected with the junction between said first MOSFET transistor and said resistive device, the other of said output terminals being connected with the junction between said second MOSFET transistor and said comparison resistor, means for switching the first and second MOSFET transistors on for simultaneous conduction, and voltage sensing means responsive to the voltage between said output terminals.

2. The invention as defined in claim 1 wherein said first and second MOSFET transistors are comprised of two separate MOSFET transistors.

3. The invention as defined in claim 1 wherein said first and second MOSFET transistors are comprised of a single SENSEFET transistor.

4. The invention as defined in claim 1 wherein said voltage sensing means is a comparator.

5. A circuit for detecting resistance changes in a resistive device, said circuit comprising:

a bridge circuit having a pair of input terminals and a pair of output terminals, a resistive device, a comparison resistor, a SENSEFET having a gate terminal, a drain terminal, a sense cell source terminal and a power cell source terminal, the drain terminal of said SENSEFET being coupled to one of said input terminals, said resistive device being coupled between one of said output terminals and the other of said input terminals, the power cell source terminal being coupled with said one output terminal, said comparison resistor being coupled between the other of said output terminals and said other input terminal, the sense cell source terminal being coupled with said other output terminal, and voltage sensing means responsive to the voltage between said output terminals.

6. The invention as defined in claim 5 wherein said voltage sensing means is a comparator.

7. A circuit for switching and resistance sensing comprising:

a bridge circuit having a pair of bridge input terminals for coupling to a source of supply voltage and having a pair of bridge output terminals, first and second electronic switching means each having a pair of switch output terminals, a resistive device, a comparison resistor, said first switching means being connected through its switch output terminals in series with said resistive device between said bridge input terminals, said second switching means being connected through its switch output terminals in series with said comparison resistor between said bridge input terminals, means for switching said first and second electronic switching means on for simultaneous conduction, one of said bridge output terminals being connected with the junction between said first switching means and said resistive device, the other of said bridge output terminals being connected with the junction between said second switching means and said comparison resistor, and voltage sensing means responsive to the voltage between said bridge output terminals when the first and second switching means are switched on as an indication of a change of resistance of said resistive device.

8. A circuit for detecting resistance changes in a resistive device, said circuit comprising:

first and second electronic switching devices, a resistive device, a comparison resistor, said first electronic switching device and said resistive device being coupled with each other in a first series circuit, said second electronic switching device and said comparison resistor being coupled with each other in a second series circuit, means for applying a voltage across said series circuits, means for switching the first and second electronic switching devices on for simultaneous conduction, and means for comparing the voltage across said resistive device with the voltage across said comparison resistor.

9. The invention as defined in claim 8 wherein said first and second electronic switching devices are comprised of two separate MOSFET transistors.

10. The invention as defined in claim 8 wherein said first and second electronic switching devices are comprised of a single SENSEFET transistor.

* * * * *